United States Patent [19]

Suzuki

[11] 4,195,239
[45] Mar. 25, 1980

[54] FLIP-FLOP COMPRISING TWO FIELD EFFECT TRANSISTORS CONTROLLABLY CONNECTED TO NODES OF THE FLIP-FLOP AND THEN CROSSWISE TO SERVE AS A SENSE AMPLIFIER

[75] Inventor: Shunichi Suzuki, Tokyo, Japan

[73] Assignee: Nippon Electric Co., Ltd., Tokyo, Japan

[21] Appl. No.: 909,086

[22] Filed: May 24, 1978

[30] Foreign Application Priority Data

May 24, 1977 [JP] Japan .................... 52-60609

[51] Int. Cl.² .............. H03K 5/20; H03K 3/286; H03K 3/353; G11C 7/06
[52] U.S. Cl. .................... 307/355; 307/279; 307/DIG. 3; 365/205; 365/208
[58] Field of Search ............. 307/355, 362, 238, 279, 307/DIG. 3; 365/205, 207, 208, 203

[56] References Cited

U.S. PATENT DOCUMENTS

| | | | |
|---|---|---|---|
| 3,588,537 | 6/1971 | Brink | 307/DIG. 3 X |
| 3,868,656 | 2/1975 | Stein et al. | 307/DIG. 3 X |
| 3,992,704 | 11/1976 | Kantz | 307/DIG. 3 X |
| 4,000,413 | 12/1976 | Wong et al. | 307/DIG. 3 X |
| 4,028,557 | 6/1977 | Wilson | 365/205 X |
| 4,122,549 | 10/1978 | Kinoshita | 307/DIG. 3 X |
| 4,133,049 | 1/1979 | Shirato | 365/207 X |
| 4,138,740 | 2/1979 | Itoh | 307/238 X |

*Primary Examiner*—Larry N. Anagnos

*Attorney, Agent, or Firm*—Sughrue, Rothwell, Mion, Zinn and Macpeak

[57] ABSTRACT

A flip-flop usable as a sense amplifier having two insulated-gate field effect transistors that may have different threshold voltages and that have gates connected to nodes of the flip-flop, sources connected in common, and drains connected to the nodes through a first and a second control transistor rendered conductive by first clock pulses and crosswise to the gates of the other field effect transistors through a third and a fourth control transistor turned on by second clock pulses appearing in substantial coincidence with disappearance of the respective ones of the first clock pulses. Capacitive loads charged to a precharge voltage are connected to the respective nodes. A source of a first activation voltage different from the precharge voltage by a value more than the higher of the threshold voltages is connected to the transistor sources during appearance of respective ones of the first clock pulses to change the precharged levels of the respective loads to such levels that are different from the first activation voltage by the respective threshold voltages. A variation is given to the precharge level of a selected load in substantial coincidence with appearance of a selected one of the second clock pulses. A source of a second activation voltage, such as ground, different from the precharge voltage by a value more than the difference between the first activation voltage and the precharge voltage is connected to the transistor sources after appearance of the selected one of the second clock pulses. An output signal related to the variation is obtained at the node connected to the selected load.

7 Claims, 7 Drawing Figures

FLIP-FLOP COMPRISING TWO FIELD EFFECT TRANSISTORS CONTROLLABLY CONNECTED TO NODES OF THE FLIP-FLOP AND THEN CROSSWISE TO SERVE AS A SENSE AMPLIFIER

BACKGROUND OF THE INVENTION

The present invention relates to a sense amplifier formed as a flip-flop comprising insulated-gate field effect transistors, particularly MOS field effect transistors (hereafter abbreviated to MOST).

A sense amplifier is used for sensing a small difference between signal levels to produce a binary signal, given usually as logic "1" or "0" signal, in accordance with the signal level difference and is used, among others, as a sensor for sensing information stored in dynamic memories comprising MOST's. In order to raise the speed of operation, use is made within a MOST memory circuit of signals of the TTL level (from about 0.4 volt to 2.4 volts) considerably lower than the MOS level (generally, 12 volts) used for the clock signals. It is therefore necessary to amplify the signals of the TTL level to the MOS level. On the other hand, use is increasing of signal-transistor memory cells that need the smallest possible area. This is in order to cope with the requirements for denser memory capacities. When read out, the binary signals stored in a single-transistor memory cell provide a change of the order of only 0.1 to 0.5 volt in the electric potential of the digit line. The sense amplifier is indispensable for this small difference between the signal levels.

As will be described later with reference to a few figures of the accompanying drawing, a flip-flop used as a conventional sense amplifier comprises two switching transistors having the gate and the source or drain electrodes crosswide connected. Load elements are connected to the points of cross connection, each of which points serves as an input and an output point. The conventional sense amplifier has an objectionably poor sensitivity. This is mainly due to unavoidable unbalance between the electrical characteristics of the switching transistors. The sensitivity is closely studied by K. U. Stein and H. Friedrich in "1973 IEEE International Solid-State Circuits Conference—Digest of Technical Papers," pages 30–31. It is impossible at present to avoid the undesirable decrease in the sensitivity that results from the unbalance.

SUMMARY OF THE INVENTION

It is therefore an object of the instant invention to provide a sense amplifier of a high sensitivity comprising insulated-gate field effect transistors.

It is another object of this invention to provide a sense amplifier of the type described, which has the high sensitivity despite any unbalance in the electrical characterstics between the transistors used in pairs.

A sense amplifier according to this invention is associated with sources of a first and a second activation voltage. The first activation voltage is different from, e.g. higher than, the second activation voltage by a prescribed voltage and can be given by the second activation voltage by means of one or more gate-drain connected field effect transistors. The sense amplifier has a first and a second node as its input and output points and an activation point and comprises a first field effect transistor having an insulated gate electrode connected to the first node, and one of source and drain electrodes connected to the activation point, a second field effect transistor having an insulated gate electrode connected to the second node, and one of source and drain electrodes connected to the activation point. The sense amplifier of the invention further comprises first means for precharging the first and second nodes at a precharge voltage, second means for coupling the prechanged first and second nodes via the first and second transistors, respectively, and via the activation point to the source of the first activation voltage different from the precharge voltage by a value more than the higher of the threshold voltages of the first and second transistors, to change the respective voltage levels of the first and second nodes to respective levels which are different from a voltage level of the activation point (which is near or favorably equal to the first activation voltage) by the respective threshold voltages of the first and the second transistors, third means for cross-coupling the first and the second transistors to the second and the first nodes which are respectively at the changed voltage levels, and fourth means for coupling the activation point to the source of the second activation voltage, e.g. ground level, different from the precharge voltage by a value more than the difference between the first activation voltage and the precharge voltage to change one of the changed voltage levels of the first and second nodes to a level near the second activation voltage via of the cross-coupled first and second transistors. The second means may favorably include first control means between the first node and the other of the source and drain electrodes of the first transistor for controllably electrically connecting and disconnecting the first node to and from the other electrode of the first transistor, second control means between the second node and the other of the source and drain electrodes of the second transistor for controllably electrically connecting and disconnecting the second node to and from the other electrode of the second transistor simultaneously with the connection and the disconnection effected by the first control means, respectively, and first activation means for electrically connecting and disconnecting the activation point to and from the source of the first activation voltage together with the connection effected by the first and the second control means and with the disconnection effected by the first and the second control means. The third means may include third control means between the first node and the second electrode of the second transistor for controllably electrically connecting the first node to the second electrode of the second transistor after or at the same time of the disconnection effected by the first and the second control means and fourth control means between the second node and the second electrode of the first transistor for controllably electrically connecting the second node to the second electrode of the first transistor simultaneously with the connection effected by the third control means. The fourth means may include second activation means for electrically connecting the activation point to the source of the second activation voltage after the disconnection effected by the first and the second control means.

DESCRIPTION OF THE PREFERRED EMBODIMENTS

Figure 1:
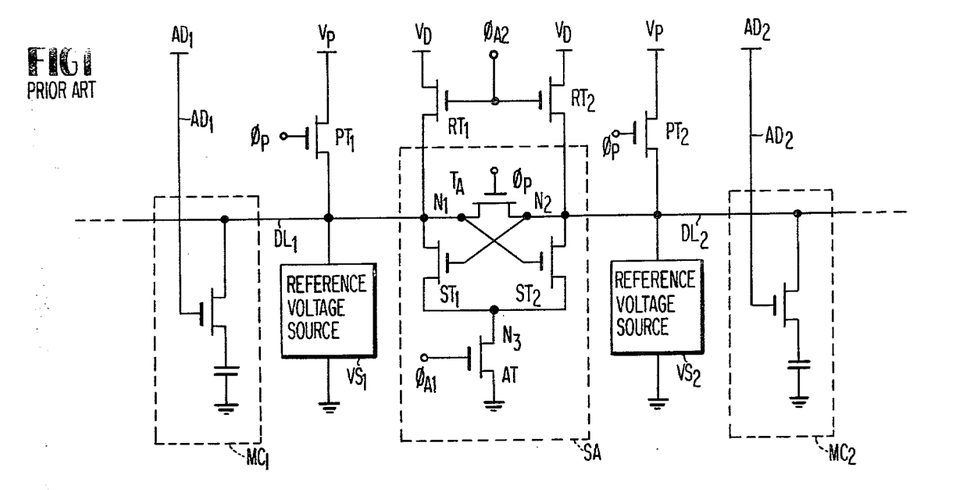
FIG. 1 shows partly in blocks a conventional sense amplifier together with sources of various signals and portions of two memory cells.
Figure 2:
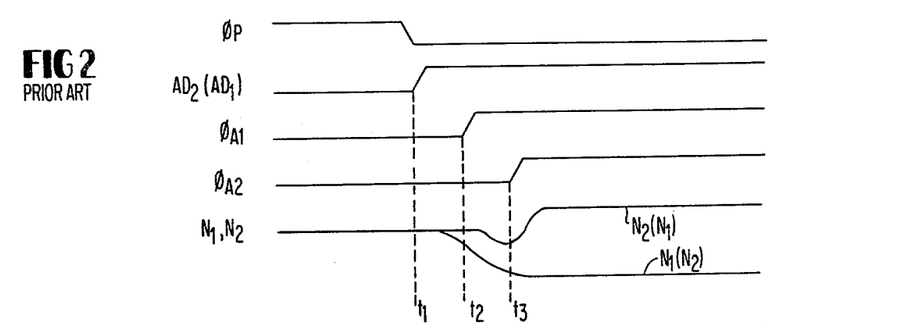
FIG. 2 illustrates a few signals that are used in the circuitry illustrated in FIG. 1.

Referring to FIGS. 1 and 2, a conventional sense amplifier SA will be described at first in connection with two memory cells for a better understanding of the present invention. The sense amplifier SA is formed as a flip-flop that comprises first and second switching transistors $ST_1$ and $ST_2$. The flip-flop has first and second nodes $N_1$ and $N_2$, each of which serves as an input and an output point, and an activation point $N_3$. The respective nodes $N_1$ and $N_2$ are connected to first and second digit lines $DL_1$ and $DL_2$ of the memory circuits that comprise a plurality of memory cells, of which only first and second memory cells $MC_1$ and $MC_2$ are depicted. Each memory cell is capable of storing cell information that is either of logic "1" and "0" values represented by two different levels, such as a high and a low level, respectively. It is to be noted that the load capacitances loaded on the respective nodes $N_1$ and $N_2$, typically the digit line capacitances, are made to be as equal to each other as possible. First and second load transistors $RT_1$ and $RT_2$ are also connected to the first at second nodes $N_1$ and $N_2$, respectively.

Referring more particularly to FIG. 1, first and second reference voltage sources $VS_1$ and $VS_2$ are connected to the respective digit lines $DL_1$ and $DL_2$ to supply the digit lines $DL_1$ and $Dl_2$ with a reference voltage of a level between the levels respesentative of the logic "1" and "0" values. When one of the memory cells connected to the first digit line $DL_1$, e.g. $MC_1$, is read out, the cell information stored in the second memory cells ($MC_2$ and others) connected to the second digit line $DL_2$ is never read out, but the reference voltage is made to be given from $VS_2$ to the second digit line $DL_2$. When a memory cell (e.g. $MC_2$) connected to the second digit line $DL_2$ is read out, the reference voltage is given by $VS_1$ to the first digit line $DL_1$. First and second precharge transistors $PT_1$ and $PT_2$ connected to the respective digit lines $DL_1$ and $DL_2$ are cyclically rendered conductive by a sequence of precharge pulses $\phi_P$ to charge the digit lines $DL_1$ and $DL_2$ to a precharge level $V_P$ before each pulse of the precharge pulse sequence $\phi_P$ builds down. An additional transistor $T_A$ interposed between the nodes $N_1$ and $N_2$ and controlled by the precharge pulses $\phi_P$ is for raising the efficiency of precharge of the digit lines $DL_1$ and $DL_2$ to the precharge level $V_P$ and may be omitted when the precharge pulses $\phi_P$ build up sufficiently higher than the precharge level $V_P$. An activation transistor AT connected to the activation point $N_3$ is controlled by a first activation pulse sequence $\phi_{A1}$ to ground the activation point $N_3$. The load transistors $RT_1$ and $RT_2$ are controlled by a second activation pulse sequence $\phi_{A2}$ to supply a power source voltage $V_D$ to the flip-flop. First and second address lines $AD_1$ and $AD_2$ for the memory cells $MC_1$ and $MC_2$ are selectively supplied with first and second address signals $AD_1$ and $AD_2$ (the same reference symbols as the address lines being used) when it is desired to read out the cell information stored in the respective memory cells $MC_1$ and $MC_2$.

Let it now be assumed information is to be read out of the second memory cell $MC_2$. The second address signal $AD_2$ is turned high (FIG. 2) immediately following a first instant $t_1$ at which a preceding precharge pulse $\phi_P$ is already rendered low. When the address line $AD_2$ is thus given a high level, electric charge is transferred between the digit line $DL_2$ and the memory cell $MC_2$. As a result, the electric potential of the digit line $DL_2$ slightly varies according as the cell information is of the logic "1" or "0" value. When cell information is of the logic "1" value, a slight increase occurs in the potential of the digit line $DL_2$. In the meantime, the first digit line $DL_1$ is supplied with the reference voltage. The node voltage of the second node $N_2$ therefore becomes slightly higher than the node voltage of the first node $N_1$ by, for example, about 0.1 volt or 100 mV at a second instant $t_2$ at which the first activation pulse $\phi_{A1}$ immediately following build up of the address signal $AD_2$ is turned on. Inasmuch as the first node voltage is lower than the second node voltage, the first switching transistor $ST_1$ is rendered more conductive than the second switching $ST_2$. The first node voltage therefore decreases more rapidly towards ground than the second node voltage. This turns the first switching transistor $ST_1$ still more conductive than the second switching transistor $ST_2$. In other words, the second switching transistor $ST_2$ is rendered increasingly more resistive relative to the first switching transistor $ST_1$. This retards the speed of decrease of the second node voltage. The difference between the first and the second node voltages therefore grows to an appreciable value at a third instant $t_3$ at which the second activation pulse $\phi_{A2}$ is turned high. The very slowly decreasing tendency of the second node voltage is now overcome by the power source voltage $V_D$. Inasmuch as the first switching transistor $ST_1$ is appreciably conductive, the first node voltage is kept low despite the power source voltage $V_D$. It is now understood that the sense amplifier SA is similarly operable even when the cell information is of the logic "0" value and even when it is desired to read out the first memory cell $MC_1$ and others. Use is possible of a single activation pulse sequence instead of the first and the second activation pulse sequences $\phi_{A1}$ and $\phi_{A2}$.

With a sense amplifier of the type illustrated with reference to FIGS. 1 and 2, balance is mandatory between the electrical characteristics of the respective transistor pairs, particularly the switching transistor pair $ST_1$ and $ST_2$, and between the values of the loads connected to the respective nodes $N_1$ and $N_2$. It is, however, difficult to manufacture the transistor pairs with allowably identical electrical characteristics, respectively. This has inevitably seriously adversely affected the sensitivity of the sence amplifier as pointed out in the preamble of the instant specification. For example, let a difference of 100 mV be present between the threshold voltages of the switching transistor pair $ST_1$ and $ST_2$. A sense amplifier with this switching transistor pair is incapable of sensing signals having a difference of less than about 100 mV between the signal levels.

Figure 3:
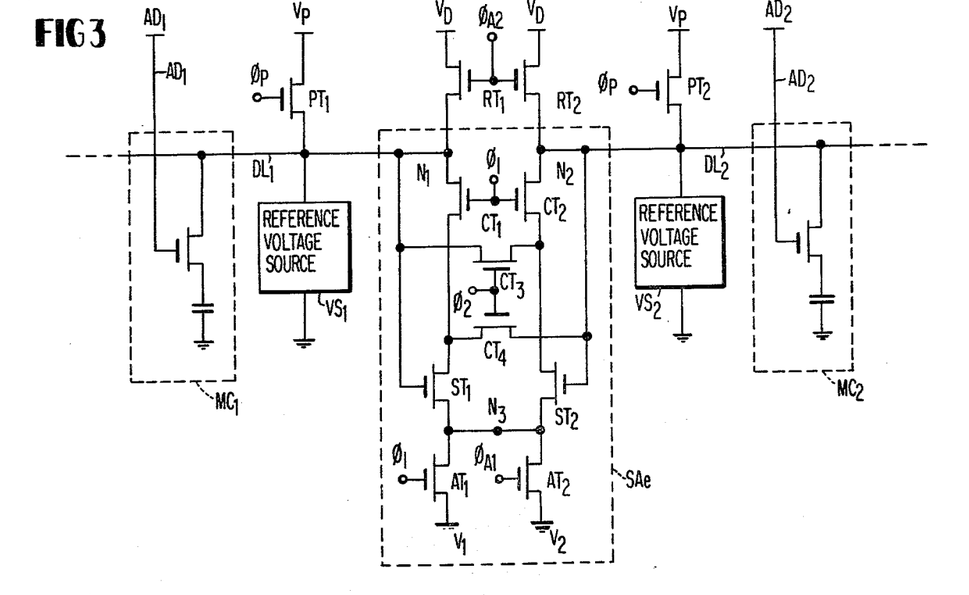
FIG. 3 shows partly in blocks a sense amplifier according to a first embodiment of the instant invention together with sources of various signals and the memory cells portions illustrated in FIG. 1.
Figures 4, 5, 6:
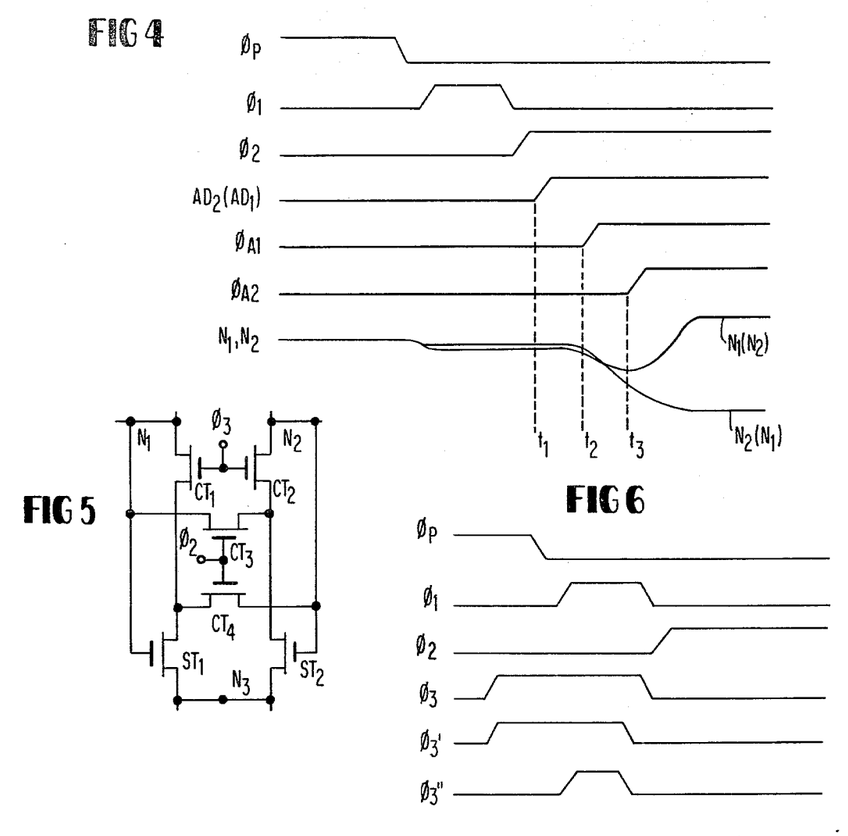
FIG. 4 illustrates several signals that are used in the circuitry depicted in FIG. 3.
FIG. 5 is a partial circuit diagram of a sense amplifier according to a second embodiment of this invention.
FIG. 6 shows a few signals that are used in the sense amplifier illustrated partly in FIG. 5.

Turning now to FIGS. 3 and 4, a sense amplifier SAe according to a first embodiment of this invention is illustrated together with, as described in conjunction with FIG. 1, first and second digit or bit lines $DL_1$ and $DL_2$, first and second memory cells $MC_1$ and $MC_2$, first and second address lines $AD_1$ and $AD_2$ selectively supplied with first and second address signals $AD_1$ and $AD_2$, first and second precharge transistors $PT_1$ and $PT_2$, first and second load transistors $RT_1$ and $RT_2$, and first and second reference voltage sources $VS_1$ and $VS_2$. The sense amplifier SAe has first and second nodes $N_1$ and $N_2$ and an activation or common point $N_3$ and is associated with sources of a precharge pulse sequence $\phi_P$, first and second clock pulse sequences $\phi_1$ and $\phi_2$, first and second activation pulse sequences $\phi_{A1}$ and $\phi_{A2}$, and first and second activation voltages $V_1$ and $V_2$, the second activation voltage $V_2$ being ground in the example being illustrated.

Referring more specifically to FIG. 3, the sense amplifier SAe comprises first and second switching MOS transistors $ST_1$ and $ST_2$, first to fourth control MOS transistors $CT_1$ to $CT_4$, and first and second activation MOS transistors $AT_1$ and $AT_2$. The first switching transistor $ST_1$ has a gate electrode connected to the first node $N_1$ and one of source and drain electrodes connected to the activation point $N_3$. The last-mentioned electrode will be called the source electrode without loss of generality. The second switching transistor $ST_2$ has a gate electrode connected to the second node $N_2$ and a source electrode connected to the activation point $N_3$. The first control transistor $CT_1$ is connected between the first node $N_1$ and the drain electrode of the first switching transistor $ST_1$ and has a gate electrode supplied with the first clock pulses $\phi_1$. The second control transistor $CT_2$ connected between the second node $N_2$ and a drain electrode of the second switching transistor $ST_2$ has a gate electrode supplied also with the first clock pulses $\phi_1$. The pair of the control transistors $CT_1$ and $CT_2$ serves to connect the first and the second nodes $N_1$ and $N_2$ to the drain electrodes of the first and the second switching transistors $ST_1$ and $ST_2$, respectively. The third control transistor $CT_3$ is connected between the first node $N_1$ and the drain electrode of the second switcing transistor $ST_2$ and has a gate electrode supplied with the second clock pulses $\phi_2$. The fourth control transistor $CT_4$ connected between the second node $N_2$ and the drain electrode of the first switching transistor $ST_1$ has a gate electrode supplied also with the second clock pulses $\phi_2$. The pair of the control transistors $CT_3$ and $CT_4$, when turned conductive, cross-couples the switching transistors $ST_1$ and $ST_2$ to form a flip-flop. The first activation transistor $AT_1$ is connected between the activation point $N_3$ and the source of the first activation voltage $V_1$ and is controlled by the first clock pulses $\phi_1$. The second activation transistor $AT_2$ connected between the activation point $N_3$ and the source of the second activation voltage $V_2$ is controlled by the first activation pulses $\phi_{A1}$. The first and the second clock pulse sequences $\phi_1$ and $\phi_2$ are alternatingly given a high level so as not to simultaneously put the control transistor pairs $CT_1$–$CT_2$ and $CT_3$–$CT_4$ in the conductive state.

With the circuitry shown in FIG. 3, the digit lines $DL_1$ and $DL_2$ are precharged, in the absence of the first clock pulses $\phi_1$, to the prechange voltage $V_P$ prior to build down of each precharge pulse $\phi_P$ supplied to first and second precharge transistors $PT_1$ and $PT_2$, which are cut off when the precharge pulse $\phi_P$ goes from the high level down to the low level. When the first clock pulse sequence $\phi_1$ is subsequently given the high level, electric charge placed on the digit lines $DL_1$ and $DL_2$ decreases because the charge partly flows to the first activation voltage source $V_1$ through the first and the second control transistors $CT_1$ and $CT_2$, the switching transistors $ST_1$ and $ST_2$ now serving merely as MOS diodes, and the first activation transistor $AT_1$. The first activation voltage $V_1$ should be lower than the precharge voltage $V_P$ by an amount more than the higher of the threshold voltages of the switching transistors $ST_1$ and $ST_2$. The high level of the first clock pulse sequence $\phi_1$ should be sufficiently higher than the precharge voltage $V_P$ and consequently than the first activation voltage $V_1$. With the first clock pulses $\phi_1$ given a sufficient pulse width, the control and the switching transistors $CT_1$–$CT_2$ and $ST_1$–$ST_2$ cooperate to cause precharge levels of the digit lines $DL_1$ and $DL_2$ to be equal to the potential of the point $N_3$ (which is the same as the first activation voltage $V_1$ if the on-resistance of $AT_1$ can be neglected) plus the threshold voltages of the respective switching transistors $ST_1$ and $ST_2$. This is because the control transistors $CT_1$ and $CT_2$ are sufficiently conductive to supply the drain electrodes of the switching transistors $ST_1$ and $ST_2$ substantially with those voltages of the digit lines $DL_1$ and $DL_2$ which are supplied directly to the gate electrodes of the respective switching transistors $ST_1$ and $ST_2$. For example, let the precharge voltage $V_P$, the first activation voltage $V_1$, and the threshold voltages of the switching transistors $ST_1$ and $ST_2$ be 10.0 volts, 5.0 volts, 1.0 volt, and 1.1 volts, respectively. The modified precharge levels of the digit lines $DL_1$ and $DL_2$ are equal to 6.0 and 6.1 volts, respectively.

Further referring to FIGS. 3 and 4, the first clock pulse sequence $\phi_1$ is returned to the low level after the digit lines $DL_1$ and $DL_2$ are given the modified precharge levels mentioned above. When the second clock pulse sequence $\phi_2$ is subsequently rendered high, the sense amplifier SAe is given the structure of the conventional cross-coupled sense amplifier SA illustrated with reference to FIG. 1. It is to be noted here that the digit lines $DL_1$ and $DL_2$ are kept at the respective modified precharge levels 6.0 and 6.1 volts, which is not the case with the conventional sense amplifier SA. This is because the capacitances of the drain electrode portions of the switching transistors $ST_1$ and $ST_2$ are negligibly small in the sense amplifier SAe as compared with the digit line capacitances. With the numerical examples given above, the source electrodes of the switching transistors $ST_1$ and $ST_2$ are precharged to about $V_1$ (5.0 volts) in common. The gate electrodes of the switching transistors $ST_1$ and $ST_2$ are higher in potential than the respective source electrodes by 1.0 and 1.1 volts, namely, by the respective threshold voltages. At a first instant $t_1$ immediately following build up of the second clock pulse sequence $\phi_2$, the second address signal $AD_2$ is raised to the high level if it is desired to read the cell information from the second memory cell $MC_2$. The first digit line $DL_1$ is supplied by the first reference voltage source $VS_1$ with a reference voltage of a level between two levels representative of logic "1" and "0" values of the cell information. Electric charge is transferred between the second digit line $DL_2$ and the second memory cell $MC_2$. Let variations in the potentials of the digit lines $DL_1$ and $DL_2$ be −50 and −100 mV, respectively. The potential variations render the gate voltages of the switching transistors $ST_1$ and $ST_2$ lower by 50 and 100 mV than the respective source voltages to put the second switching transistor $ST_2$ less conductive than the first switching transistor $ST_1$.

As illustrated in FIG. 4, the first activation pulse sequence $\phi_{A1}$ is raised to a high level at a second instant $t_2$ to activate the sense amplifier SAe. The common source voltage of the switching transistors $ST_1$ and $ST_2$ gradually decreases to the second activation voltage $V_2$ from the precharged level given by the first activation voltage $V_1$ namely, about 5.0 volts in the illustrated example. Due to the difference in the conductivities, the first switching transistor $ST_1$ becomes conductive at an earlier instant than the second switching transistor $ST_2$. The resulting flip-flop function moves the voltages of the first and the second nodes $N_1$ and $N_2$ to a high and a low level and maintains the second switching transistor $ST_2$ in a substantially nonconductive state. At a third instant $t_3$, the second activation pulse sequence $\phi_{A2}$ is rendered high to turn the load transistors $RT_1$ and $RT_2$ on. As a result, the voltage of the first digit lines $DL_1$ is further increased to a value near a power source voltage $V_D$, while the level of the second digit line $DL_2$ is decreased down to about the second activation voltage $V_2$. A small level difference, such as 50 mV, given to the digit lines $DL_1$ and $DL_2$ as exemplified hereinabove is thus correctly sensed with amplification to a greater difference between the power source voltage $V_D$ and the second activation voltage $V_2$.

Turning further to FIGS. 5 and 6, a sense amplifier according to a second embodiment of this invention is similar to that illustrated with reference to FIGS. 3 and 4. In the sense amplifier partly depicted in FIG. 5, the first and the second control transistors $CT_1$ and $CT_2$ are controlled by a third clock pulse sequence $\phi_3$ rather than by the first clock pulse sequence $\phi_1$. As illustrated in FIG. 6, the third clock pulse sequence $\phi_3$ builds up earlier than the first clock pulse sequence $\phi_1$ and builds down simultaneously with the first clock pulse sequence $\phi_1$. This serves to improve the speed of the operation of modifying the precharge levels.

As a result of the modification of the precharge levels of the digit lines $DL_1$ and $DL_2$, or the first and second nodes $N_1$ and $N_2$, the drains of the first and second switching transistors $ST_1$ and $ST_2$ are precharged at respective levels substantially the same as the respective modified precharge levels of the nodes $N_1$ and $N_2$ by means of the conductive control transistors $CT_1$ and $CT_2$. However, it is desirable that the drains of $ST_1$ and $ST_2$ have substantially the same levels as the respective modified levels of the second and first nodes $N_2$ and $N_1$ after they are isolated from the nodes $N_1$ and $N_2$, respectively, by the control transistors $CT_1$ and $CT_2$ being turned off and before they are connected to the nodes $N_2$ and $N_1$, respectively, by way of the control transistors $CT_4$ and $CT_3$. This is possible by using additional transistors. It is still desirable that the voltage levels of the drains of $ST_1$ and $ST_2$ are balanced, that is, made equal to each other, after $CT_1$ and $CT_2$ are turned off, by inserting a balancing transistor between the drains of $ST_1$ and $ST_2$ or more favorably by applying a clock pulse sequence $\phi_3'$ or $\phi_3''$ (FIG. 6) instead of $\phi_3$ to the gates of $CT_1$ and $CT_2$. The clock pulse sequence $\phi_3'$ or $\phi_3''$ builds down earlier than the build down of and after the build up of the first clock pulse sequence $\phi_1$. The activation transistor $AT_1$ continues to be on, after $CT_1$ and $CT_2$ are turned to off, and therefore the voltage levels of the drains of $ST_1$ and $ST_2$ become equal to each other.

In connection with the sense amplifiers illustrated with reference to FIGS. 3 through 6, it is now understood that the precharge levels of the nodes $N_1$ and $N_2$ are automatically modified or compensated by an amount for compensating the difference in the threshold voltages, if the threshold voltages of one of the switching transistors $ST_1$ and $ST_2$ is different from that of the other. A sense amplifier according to this invention therefore has a high sensitivity even though the switching transistors $ST_1$ and $ST_2$ may be unbalanced and have different threshold voltages.

In further connection with the above, it may be pointed out here that the sensitivity of a sense amplifier of the type described depends usually on the channel conductances $\beta$ of the switching transistors $ST_1$ and $ST_2$ besides the threshold voltages thereof. It is, however, possible with a sense amplifier according to this invention to compensate in effect for the unbalance in the channel conductances by the use of a first clock pulse sequence $\phi_1$ of a narrow pulse width, such as about 100 nanoseconds. This restricts the interval of time during which the charge placed on the digit lines $DL_1$ and $DL_2$ flows through the switching transistors $ST_1$ and $ST_2$ and others. As a result, the precharge levels are modified to be different from each other by an amount sufficient to compensate for the channel conductance unbalance. More particularly, let it be presumed that the channel conductance of the first switching transistor $ST_1$ is higher than that of the second switching transistor $ST_2$ by 5%. The precharge levels of the digit lines $DL_1$ and $DL_2$ are, for example, 6.10 and 6.12 volts, respectively. When the second clock pulse sequence $\phi_2$ is given the high level, the digit lines $DL_1$ and $DL_2$ are connected to the drain electrodes of the second and the first switching transistors $ST_2$ and $ST_1$, respectively. Inasmuch as the potential given to the gate electrode of the second switching transistor $ST_2$ is now 20 mV higher than the potential given to the gate electrode of the first switching transistor $ST_1$, it is possible to automatically compensate for the deviation in the channel conductance.

It may also be pointed out here that use of the first and the second clock pulse sequences $\phi_1$ and $\phi_2$ and unbalance of the control transistors do not substantially adversely affect the sensitivity. This is because it is made possible to neglect the difference between the threshold voltages of the control transistors $CT_1$ through $CT_4$ and between the channel conductances thereof by giving a sufficiently high level to the respective pulses of the sequences $\phi_1$ and $\phi_2$. Furthermore, the difference between the gate overlap capacitances is negligibly small as compared with the capacitances of the nodes $N_1$ and $N_2$ or the digit lines $DL_1$ and $DL_2$ that are to be precharged to the respective precharge leves. The last-mentioned difference therefore scarcely adversely affects the sensitivity. By way of example, the reduction in the sensitivity is only from 4 to 7 mV even in the worst case where the unbalance between the electrical characteristics of the first and the second control transistors $CT_1$ and $CT_2$ is superposed on the unbalance between the electrical characteristics of the third and the fourth control transistors $CT_3$ and $CT_4$ on the respective sides of the nodes $N_1$ and $N_2$ and where the degrees of the unbalance are maxima.

Although it has implicitly been taken for granted in the above description of the sense amplifiers according to this invention that the transistors $ST_1$, $ST_2$, and so forth are n-channel MOST's, a sense amplifier according to this invention may obviously comprise p-channel MOST's and/or other insulated-gate field effect transistors in place of the n-channel MOST's. It is also implicitly surmised that the power source voltage $V_D$ is higher than the precharge voltage $V_P$. Use is, however, possible to a single power source voltage in common for the power source voltage $V_D$ and the precharge voltage $V_P$ provided that the first clock pulse sequence $\phi_1$ is given a longer pulse width. For a higher speed of operation, it is possible to make the second clock pulses $\phi_2$ and the address signals $AD_1$ and $AD_2$ build up immediately following the build down of the first clock pulses $\phi_1$ and to make the first and the second activation pulses $\phi_{A1}$ and $\phi_{A2}$ build up simultaneously with the address signals $AD_1$ and $AD_2$. The expression "in substantial coincidence" in the appended claims implies these timings between the clock and the address signals including the timing of the third clock pulses $\phi_3$ described in connection with FIGS. 5 and 6.

Figure 7:
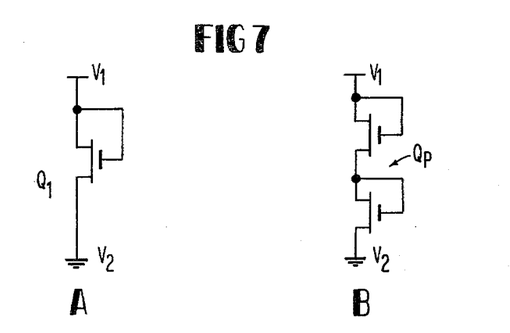
FIG. 7 is circuit diagrams showing examples of a circuit producing the first activation voltage by use of the second activation voltage.

In the embodiment shown in FIG. 3, the two low level voltages $V_1$ and $V_2$ are used in the n-channel MOST's circuit. Among them, the first activation voltage $V_1$ can be produced from the second activation voltage $V_2$, and two separate power sources are not necessary. Examples are illustrated in FIGS. 7A and 7B. As shown in FIG. 7A, it is possible to obtain the voltage $V_1$ from the drain electrode of a MOST $Q_1$ having gate connected to its drain and source connected to the voltage $V_2$. As shown in FIG. 7B, a series connection $Q_P$ of a plurality of drain-gate connected MOST's, or MQS diodes, may be used in place of a single MOST $Q_1$.

As a modification of the peripheral circuit of the sense amplifier illustrated with reference to FIG. 3, it is possible to interpose, in order to reduce the power consumption, transfer gates between each of the nodes $N_1$ and $N_2$ and each of the respective digit lines $DL_1$ and $DL_2$, as disclosed in the U.S. Pat. No. 4,061,999, instead of using the load transistors $RT_1$ and $RT_2$ controlled by the second clock pulse sequence $\phi_{A2}$ in supplying the power source voltage $V_D$ to the digit lines $DL_1$ and $DL_2$. Also, the load transistors $RT_1$ and $RT_2$ of the flip-flop circuit can be replaced by the dynamic load structure disclosed in the U.S. Pat. No. 3,987,315. The load transistors $RT_1$ and $RT_2$ are therefore not essential to the sense amplifier of the invention. The concept of raising the sensitivity in accordance with this invention is equally well applicable to various known circuits for setting the write-in levels after read out.

What is claimed is:

1. A sense amplifier for use in combination with sources of a first and a second activation voltage, said sense amplifier having a first and a second node and an activation point and comprising:

precharge means for precharging said first and second nodes to a precharge voltage;

a first field effect transistor having an insulated gate connected to said first node, and a first of source and drain connected to said activation point;

a second field effect transistor having an insulated gate connected to said second node, and a first of source and drain connected to said activation point;

first control means between said first node and a second of the source and drain of said first field effect transistor for controllably electrically connecting and disconnecting said first node to and from said second of the source and drain of said first field effect transistor;

second control means between said second node and a second of the source and drain of said second field effect transistor for controllably electrically connecting and disconnecting said second node to and from said second of the source and drain of said second field effect transistor simultaneously with the connection and the disconnection effected by said first control means, respectively;

third control means between said first node and said second of the source and drain of said second field effect transistor for controllably electrically connecting said first node to said second of drain and source of said second field effect transistor in substantial coincidence with the disconnection effected by said first and said second control means;

fourth control means between said second node and said second of the source and drain of said first field effect transistor for controllably electrically connecting said second node to said second of drain and source of said first field effect transistor simultaneously with the connection effected by said third control means;

first activation means for electrically connecting and disconnecting said activation point to and from the source of said first activation voltage in substantial coincidence with the connection effected by said first and said second control means and simultaneously with the disconnection effected by said first and said second control means, respectively; and second activation means for electrically connecting said activation point to the source of said second activation voltage after the disconnection effected by said first and said second control means, wherein said first activation voltage is higher than said second activation voltage by at least the higher threshold voltage between said first and second transistors and is lower than said precharge voltage by at least said higher threshold voltage.

2. A sense amplifier responsive to an input signal for producing an output signal and for use in combination with:

sources of a precharge pulse sequence, a first and a second clock pulse sequence, an activation pulse sequence, and a first and a second activation voltage, the pulses of said first clock pulse sequence appearing after disappearance of the respective pulses of said precharge pulse sequence, the pulses of said second clock and said activation pulse sequences appearing in substantial coincidence with disappearance of the respective pulses of said first clock pulse sequence, said second activation voltage being lower than said first activation voltage; and a first and a second capacitive load capable of being supplied with separate voltages, respectively, means responsive to each pulse of said precharge pulse sequence for charging said loads to a precharge voltage, and means for giving a variation to the voltage of a selected one of said loads in substantial coincidence with appearance of a selected pulse of said second clock pulse sequence;

said sense amplifier having a first and a second node and an activation point, said first and said second nodes being for connection to said first and said second capacitive loads, respectively, said input signal being determined by the variation given to the voltage of said selected capacitive load to one of said nodes that is connected to said selected capacitive load, said output signal being supplied from said one node to said selected capacitive load, said sense amplifier comprising:

a first field effect transistor having a threshold voltage less said variation, an insulated gate electrode connected to said first node, a source connected to said activation point, and a drain;

a second field effect transistor having a threshold voltage less said variation, an insulated gate connected to said second node, a source electrode connected to said activation point, and a drain;

a first control transistor between said first node and the drain of said first field effect transistor;

a second control transistor between said second node and the drain of said second field effect transistor;

a third control transistor between said first node and the drain of said second field effect transistor;

a fourth control transistor between said second node and the drain of said first field effect transistor;

first control means responsive to each pulse of said first clock pulse sequence for rendering said first and said second control transistors conductive;

second control means responsive to each pulse of said second clock pulse sequence for rendering said third and said fourth control transistors conductive;

first activation means for supplying said first activation voltage to said activation point in substantial coincidence with appearance of each pulse of said first clock pulse sequence to thereby modify the precharge voltage of the capacitive loads connected to said nodes to precharge levels, respectively, and for superposing said variation on the precharge level of said selected capacitive load in substantial coincidence with appearance of said selected pulse of said second clock pulse sequence; and second activation means responsive to each pulse of said activation pulse sequence for supplying said second activation voltage to said activation point to thereby make said first and said second field effect transistors cooperate to deliver said output signal to said one node, said first activation voltage being higher than said second activation voltage by at least the higher threshold voltage between said first and second transistors and lower than said precharge voltage by at least said higher threshold voltage.

3. A sense amplifier for use in combination with sources of a first and a second clock pulse sequence and a first and a second activation voltage, the pulses of said first clock pulse sequence disappearing in substantial coincidence with appearance of the respective pulses of said second clock pulse sequence, said sense amplifier having a first and a second node and an activation point and comprising:

precharge means for precharging said first and second nodes to a precharge voltage;

a first field effect transistor having an insulated gate connected to said first node and a first of source and drain connected to said activation point;

a second field effect transistor having an insulated gate connected to said second node and a first of source and drain connected to said activation point;

first control means between said first node and a second of the source and drain of said first field effect transistor and between said second node and a second of the source and drain of said second field effect transistor for electrically connecting and disconnecting said first and said second nodes to and from said second of said first and said second field effect transistors, respectively, in substantial coincidence with appearance of each pulse of said first clock pulse sequence and simultaneously with disappearance of each pulse of said first clock pulse sequence;

second control means between said first node and said second of the source and drain of said second field effect transistor and between said second node and said second of the source and drain of said first field effect transistor and responsive to the pulses of said second clock pulse sequence for connecting said first and said second nodes to said second of the source and drain of said second and said first field effect transistors, respectively;

first activation means responsive to the pulses of said first clock pulse sequence for supplying said first activation voltage to said activation point; and second activation means for supplying said second activation voltage to said activation point in substantial coincidence with appearance of the pulses of said second clock pulse sequence, said first activation voltage being higher than said second activation voltage by at least the higher threshold voltage of said first and second transistors and being lower than said precharge voltage by at least said higher threshold voltage.

4. A sense amplifier as claimed in claim 3 for producing an output signal in response to an input signal and for use in further combination with:

sources of a power supply pulse sequence and a power supply voltage not lower than a predetermined voltage, the pulses of said power supply pulse sequence appearing after appearance of the respective pulses of said second clock pulse sequence; and a first and a second capacitive load capable of being charged to separate voltages, respectively, means responsive to each of precharge pulses disappearing in substantial coincidence with the respective pulses of said first clock pulse sequence for charging said loads to a precharge voltage, and means for giving a variation to the voltage of a selected one of said loads in substantial coincidence with appearance of a selected pulse of said second clock pulse sequence;

said first and said second nodes being for connection to said first and said second capacitive loads, respectively, said input signal being determined by the variation given to the voltage of said selected capacitive load to one of said nodes that is connected to said selected capacitive load, said output signal being supplied from said one node to said selected capacitive load;

said first activation means, while supplying said first activation voltage to said activation point, modifying the precharge voltage of said first and said second capacitive loads to a first and a second precharge level, respectively, and superposing said variation on the precharge level of said selected capacitive load;

said second activation means, while supplying said second activation voltage to said activation point, developing a difference between the conductivities of said first and said second field effect transistors in compliance with said variation;

said sense amplifier further comprising means responsive to that pulse of said power supply pulse sequence which appears after appearance of said selected pulse of said second clock pulse sequence for supplying said power supply voltage to both of said first and said second nodes to thereby make said first and said second field effect transistors cooperate to supply said one node said output signal of a level substantially equal to one of said power supply voltage and said second activation voltage that is determined by said variation.

5. A sense amplifier comprising a first node, a second node, a common node, means for supplying said first and second nodes with a precharge voltage, a first insulated-gate field-effect transistor having a gate connected to said first node and a source connected to said common node, a second insulated-gate field-effect transistor having a gate connected to said second node and a source connected to said common node, a third insulated-gate field-effect transistor having a drain connected to said first node and a source electrode connected to the drain of said first transistor, a fourth insulated-gate field-effect transistor having a drain connected to said second node and a source connected to the drain of said second transistor, a fifth insulated-gate field-effect transistor having a drain connected to the source of said fourth transistor and a source connected to said first node, a sixth insulated-gate field-effect transistor having a drain connected to the source of said third transistor and a source connected to said second node, a first and a second capacitive load connected to said first and second nodes respectively, a first voltage supply means for supplying a first voltage to said common node, a second voltage supply means for supplying a second voltage less than said first voltage by at least the higher threshold voltage between said first and second transistors, said first voltage being less than said precharge voltage by at least said higher threshold voltage, a first gate transistor connected between said common node and said first voltage supply means, a second gate transistor connected between said common node and said second voltage supply means, a source of first clock pulses coupled to the gate of said third, fourth and first gate transistors, and a source of second clock pulses coupled to the gate of said fifth, sixth and second gate transistors, said second clock pulse being energized subsequently to the energization of said first clock pulse.

6. The sense amplifier of claim 5 further comprising means for precharging said first and second capacitive loads with a precharge voltage higher than said first voltage by at least said higher threshold voltage.

7. A sense amplifier comprising a first, a second and a third node, means for precharging said first and second nodes at a first voltage level, a first and a second insulated-gate field effect transistors commonly connected to said third node whose gates are respectively coupled with said first and second nodes, means for coupling the precharged first and second nodes via said first and second transistors, respectively, and via said third node to a first potential source having a second voltage level which is different from said first voltage level by a first value more than a threshold voltage of either of said first and second transistors to change the voltage level of said first node to a third voltage level which is different from a voltage level of said third node by a value substantially equal to the threshold voltage of said first transistor and also to change the voltage level of said second node to a fourth voltage level which is different from the voltage level of said third node by a value substantially equal to the threshold voltage of said second transistor, means for cross-coupling said first and second transistors to said second and first nodes at said fourth and third voltage levels, and means for coupling said third node to a second potential source having a fifth voltage level which is different from said second voltage level by a value more than said first value to change one of said third and fourth voltage levels of said first and second nodes near said fifth voltage level via one of the cross-coupled second and first transistors.

* * * * *

UNITED STATES PATENT AND TRADEMARK OFFICE
CERTIFICATE OF CORRECTION

PATENT NO. : 4,195,239
DATED : March 25, 1980
INVENTOR(S) : Shunichi SUZUKI

It is certified that error appears in the above—identified patent and that said Letters Patent is hereby corrected as shown below:

IN THE SPECIFICATION

Column 3, line 41, delete "$Dl_2$" and insert -- $DL_2$ -- .

Column 9, line 6, after "possible" delete "to" and insert -- of -- .

Signed and Sealed this

Eighteenth Day of November 1980

[SEAL]

Attest:

SIDNEY A. DIAMOND

Attesting Officer

Commissioner of Patents and Trademark